US008537873B2

United States Patent
Lee et al.

(10) Patent No.: US 8,537,873 B2
(45) Date of Patent: Sep. 17, 2013

(54) HIGH POWER SURFACE MOUNT TECHNOLOGY PACKAGE FOR SIDE EMITTING LASER DIODE

(75) Inventors: Kong Weng Lee, San Jose, CA (US); James Yonghong Guo, Fremont, CA (US); Vincent V. Wong, Los Altos, CA (US); Jay A. Skidmore, San Jose, CA (US); An-Chun Tien, San Jose, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 0 days.

(21) Appl. No.: 13/554,319

(22) Filed: Jul. 20, 2012

(65) Prior Publication Data

US 2013/0022069 A1    Jan. 24, 2013

Related U.S. Application Data

(60) Provisional application No. 61/509,771, filed on Jul. 20, 2011.

(51) Int. Cl.
*H01S 3/08* (2006.01)

(52) U.S. Cl.
USPC .............. 372/99; 372/34; 372/36; 372/50.12; 372/108

(58) Field of Classification Search
USPC ............................ 372/34, 36, 99, 50.12, 108
See application file for complete search history.

(56) References Cited

U.S. PATENT DOCUMENTS

| | | | | |
|---|---|---|---|---|
| 5,602,863 | A * | 2/1997 | Itagaki | 372/50.21 |
| 5,642,373 | A * | 6/1997 | Kamizato et al. | 372/50.1 |
| 6,999,491 | B2 * | 2/2006 | Rieger et al. | 372/75 |
| 7,245,645 | B2 * | 7/2007 | Behfar et al. | 372/50.1 |
| 2007/0085101 | A1 * | 4/2007 | Kim | 257/98 |
| 2008/0234560 | A1 * | 9/2008 | Nomoto et al. | 600/310 |
| 2010/0158059 | A1 * | 6/2010 | Yoshikawa | 372/36 |

* cited by examiner

*Primary Examiner* — Yuanda Zhang
(74) *Attorney, Agent, or Firm* — Matthew A. Pequignot; Pequignot + Myers LLC

(57) ABSTRACT

The present invention relates to the packaging of high power laser(s) in a surface mount technology (SMT) configuration at low-cost using wafer-scale processing. A reflective sidewall is used to redirect the output emission from edge-emitting lasers through an optical element (e.g., a diffuser, lens, etc.). A common electrical pad centered inside the package provides p-side connection to multiple laser diodes (i.e. for power scalability). Thick plating (e.g. 75 um to 125 um) with a heat and electrically conductive material, e.g. copper, on a raised bonding area of a substrate provides good heat dissipation and spreading to the substrate layer during operation. The composite CTE of the substrate layer, e.g. AlN, and the heat/electrical conductive plating, e.g. Cu, substantially matches well with the laser substrates, e.g. GaAs-based, without the requirement for an additional submount.

11 Claims, 9 Drawing Sheets

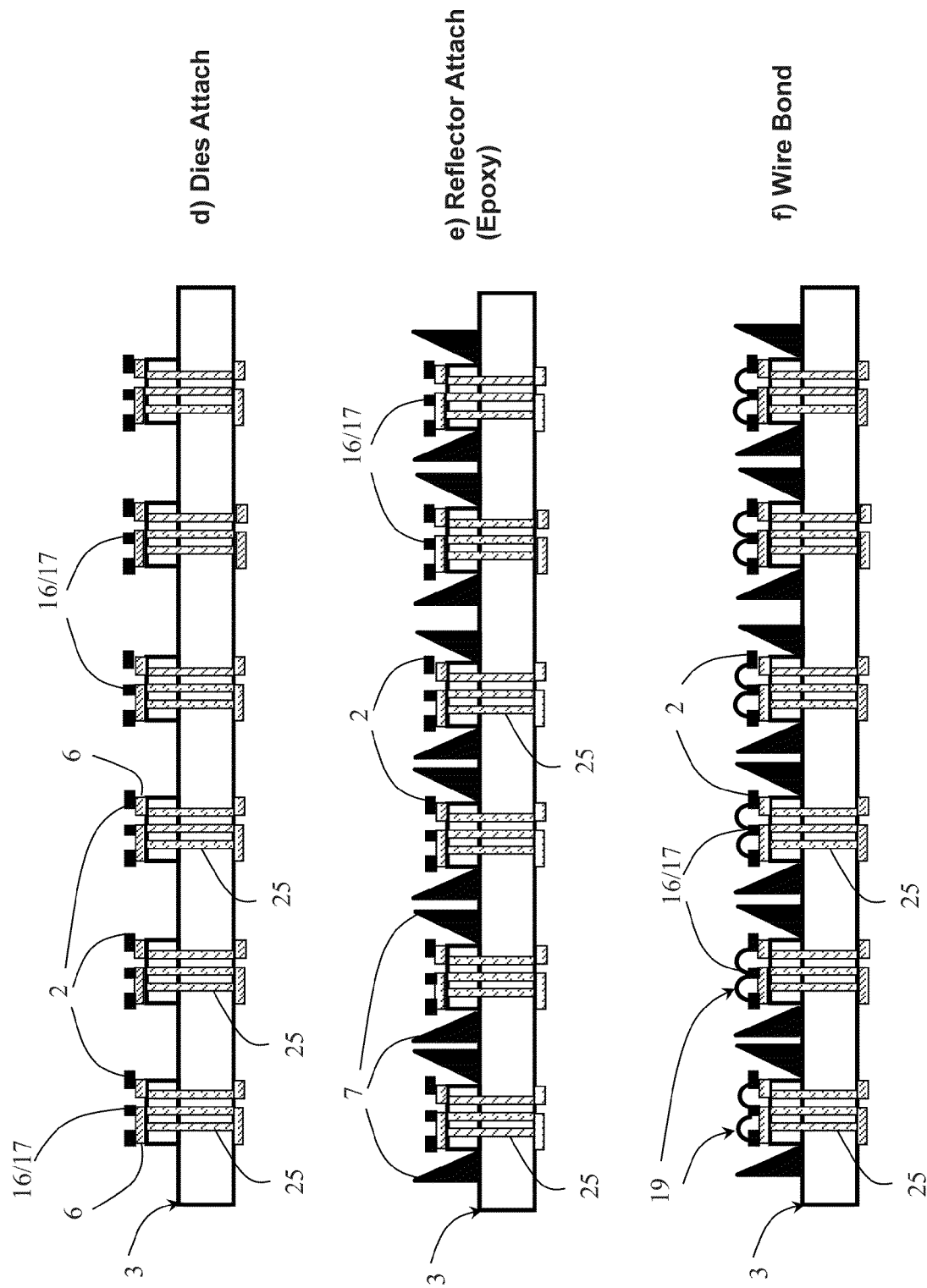

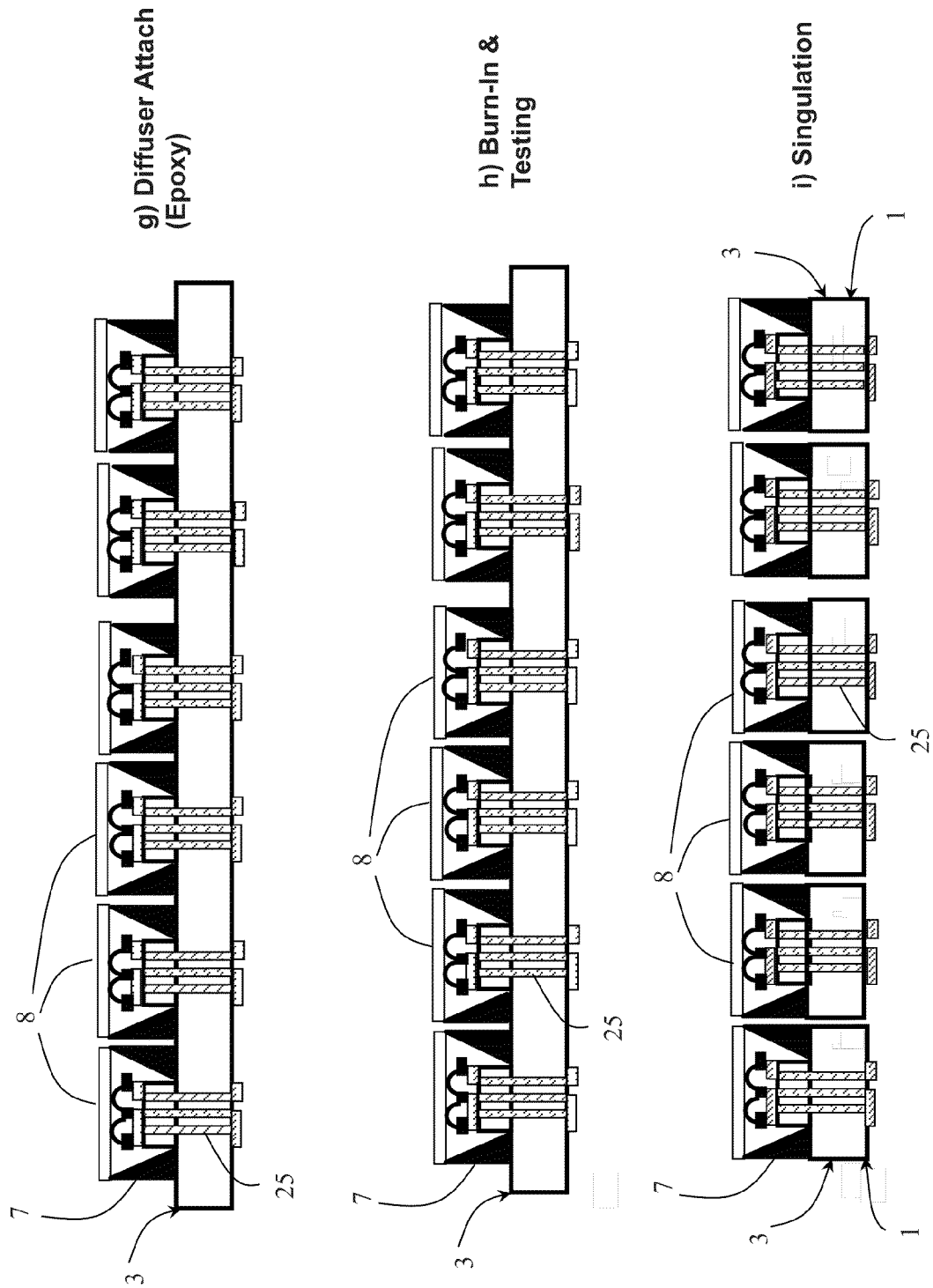

HIGH POWER SURFACE MOUNT TECHNOLOGY PACKAGE FOR SIDE EMITTING LASER DIODE

CROSS-REFERENCE TO RELATED APPLICATIONS

The present invention claims priority from U.S. Patent Application No. 61/509,771 filed Jul. 20, 2011, which is incorporated herein by reference for all purposes.

TECHNICAL FIELD

The present invention relates to laser packaging, and in particular to a the packaging of high power lasers in a surface mount technology (SMT) configuration at low-cost.

BACKGROUND OF THE INVENTION

FIG. 1 is a perspective view of a conventional transistor outline (TO) can optical module package 100. The conventional TO-can package 100 comprises a base 101, with a heat sink (e.g. copper) block 111 and/or ceramic submount extending upwardly therefrom, and a plurality of electrical leads 102 extending therethrough. Typically, the leads 102 comprise two leads for driving a laser diode (LD) 103 and two leads for biasing a monitor photodiode (MPD) 104. The LD 103 and the MPD 104 are arranged on the surface the base 101 so that the mounted LD 103 points upwardly so that light emission is along the optical axis of the TO-can 100, and so that the MPD 104 receives a portion of the light emitted from the rear of the LD 103. In particular, LD 103 is mounted on the submount 111, e.g. with a hard solder (AuSn), with the MPD 104 disposed on the base 101 directly below the LD 103. The LD 103 and the MPD 104 are connected to the leads 102 by, for example, wire bonding.

The leads 102 are coaxially aligned via through-holes 113, which extend through the lower and upper surfaces of the base 101. The through-holes 113 are filled with a glass sealant 105, which is in a heated, fluid state during assembly, cools to a solid state, thereby fixing the leads 102 to the base 101 and hermetically sealing the through holes 113 at the same time. A cap 115, typically constructed from a material, e.g. Kovar, with a coefficient of thermal expansion matched to that of silica or glass, is mounted on the base 101 over top of the aforementioned electro-optical elements with some form of hermetical seal. Lensing 116 is typically provided along the optical axis of the TO-can 100 to control, e.g. focus, collimate, the light exiting the LD 103.

Unfortunately, TO-can packages do not scale well for high average power, and do not enable laser drivers to be positioned in close proximity to the laser. Accordingly, recent demand for LDs and multi-LD packages operating at high bit rates (>10 Gb/s) have necessitated modifications to the conventional TO can arrangement. For example, the number of leads must be increased to at least six, and the lengths of the leads extending from the TO can must be minimized. The amount of heat dissipated from the TO can must be increased. Moreover, it is highly beneficial for some of the electrical components to be disposed adjacent the laser, which is impossible with the current TO can structure.

An object of the present invention is to overcome the shortcomings of the prior art by providing a compact laser package with up to a plurality of laser diodes with minimal lead lengths utilizing a reflective ring to redirect light perpendicular to the substrate and out of the package.

SUMMARY OF THE INVENTION

Accordingly, the present invention relates to a laser emitter package comprising:

a substrate including a thermally and electrically conductive plating on an upper surface thereof;

a plurality of laser emitters disposed on the substrate for emitting light parallel to the upper surface of the substrate;

a reflector ring for reflecting the light from laser emitters; and a laser driver disposed on the substrate between the plurality of laser drivers for driving the plurality of laser emitters.

BRIEF DESCRIPTION OF THE DRAWINGS

The invention will be described in greater detail with reference to the accompanying drawings which represent preferred embodiments thereof, wherein.

DETAILED DESCRIPTION

Figure 1:
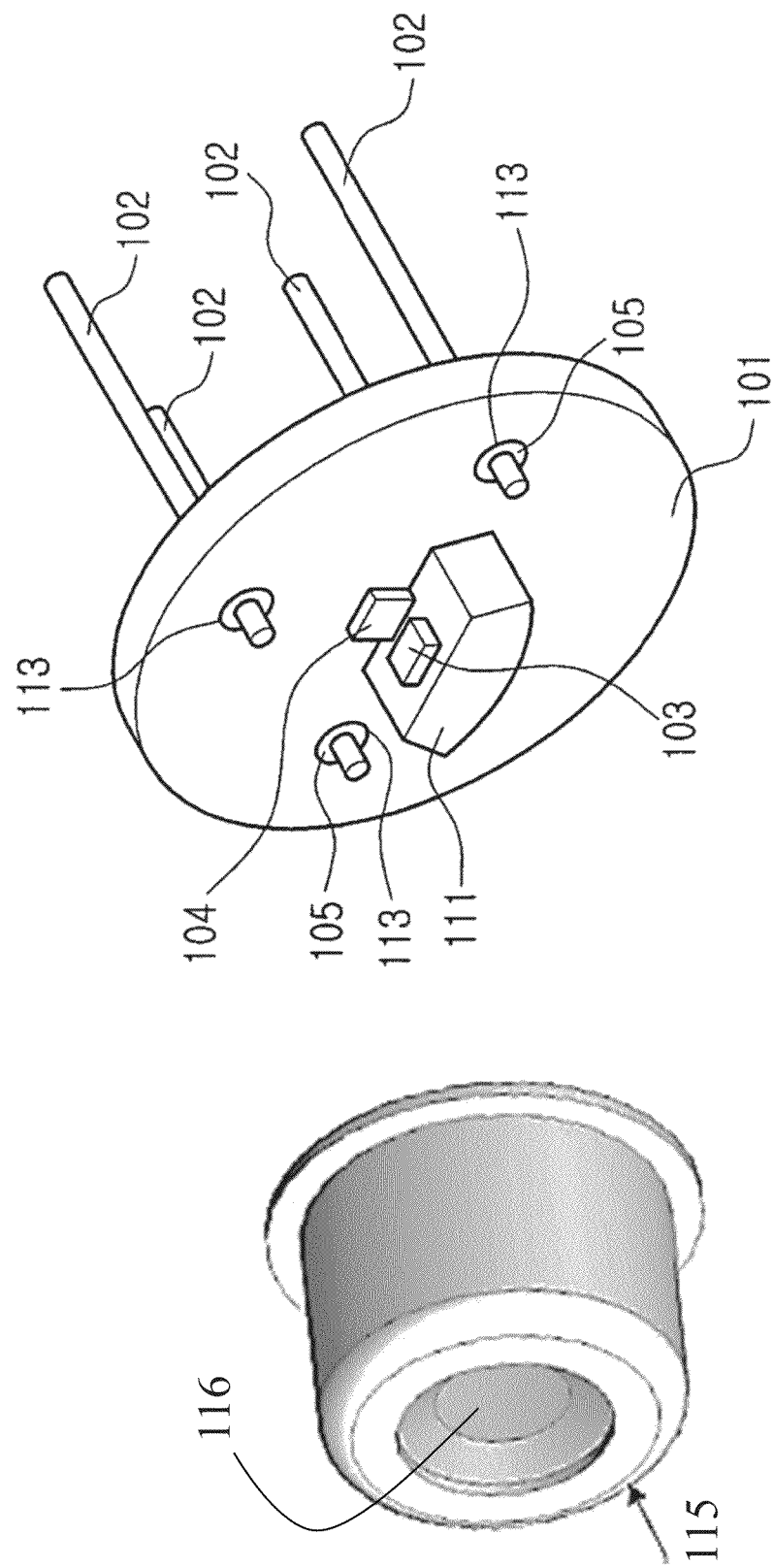
FIG. 1 is a isometric view of a conventional laser drive package.
Figure 2:
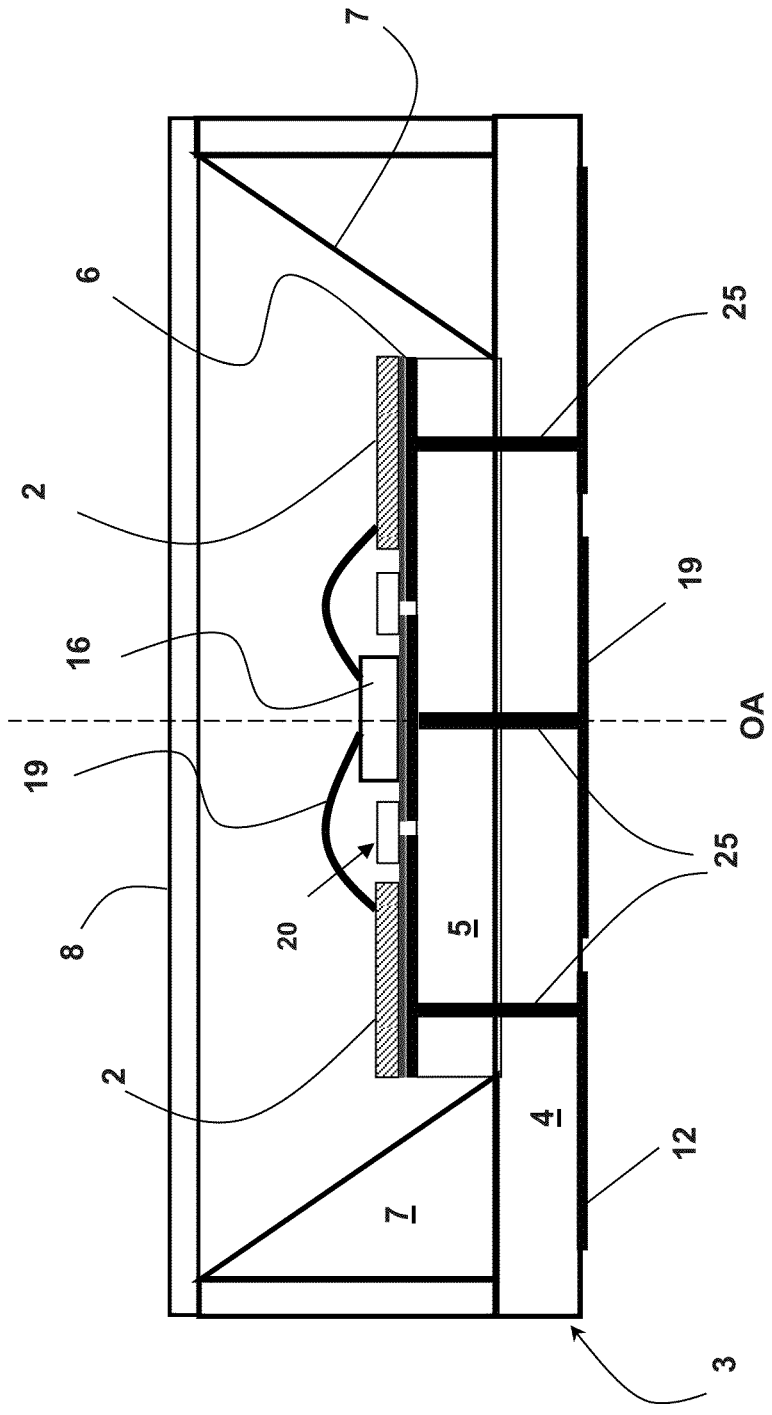
FIG. 2 is a cross-sectional view of a laser emitter package in accordance with the present invention.

The laser package 1, in accordance with the present invention, with reference to FIG. 2, includes a plurality of, e.g. four or more, laser diodes (LD) 2 directly attached to a thermally and electrically conductive substrate 3 with a solder, e.g. AuSn. Each edge or side emitting LD 2 is mounted parallel to the substrate 3, so that light is emitted perpendicular to the longitudinal optical axis of emission OA.

Ideally, the substrate 3 includes a base 4 with a thin layer of plating 6, e.g. from 75 um to 150 um thick of a metallic material, e.g. copper, silver or gold. The material making up the base 4 of the substrate 3 can be any suitable material, but ideally the composite material, i.e. plating 6 and base 4, is nominally CTE-matched to the material forming the LD 1, e.g. GaAs, which enables improved heat sinking, as well as eliminates the need for a ceramic submount between the LD 2 and the substrate 3, thereby reducing cost. The substrate 3 includes a raised or stepped bonding pad section 5 extending upwardly into the body of the laser package 1 for supporting the LDs 2. The raised section 5 is ideally cylindrical with a circular upper surface for supporting the LDs 2, which are equally spaced apart and radially extending around the circumference of the upper surface, but could also be comprised of a multi-facet structure.

Figure 3B:
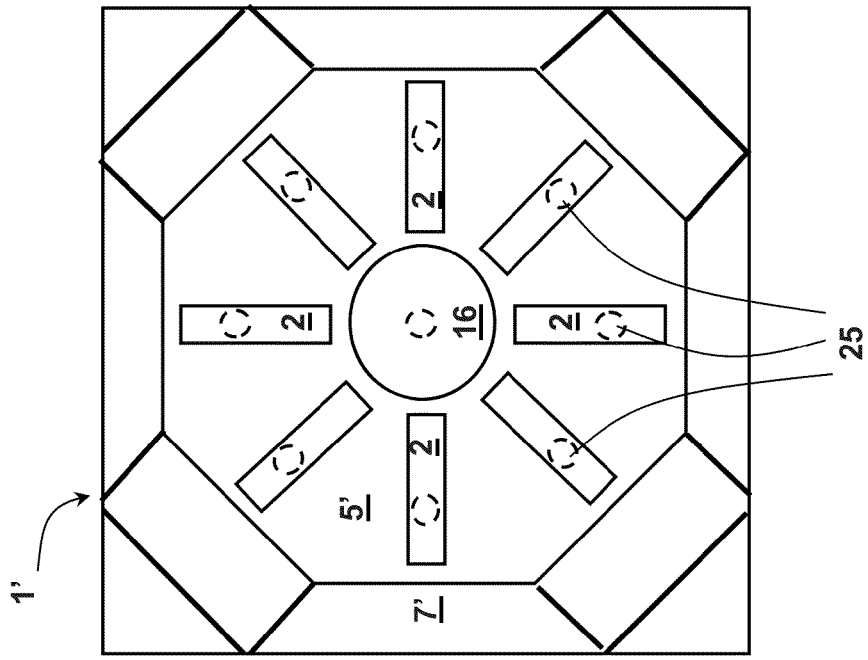
FIG. 3b is a top view of a second embodiment of the laser emitter package of FIG. 2.
Figure 3A:
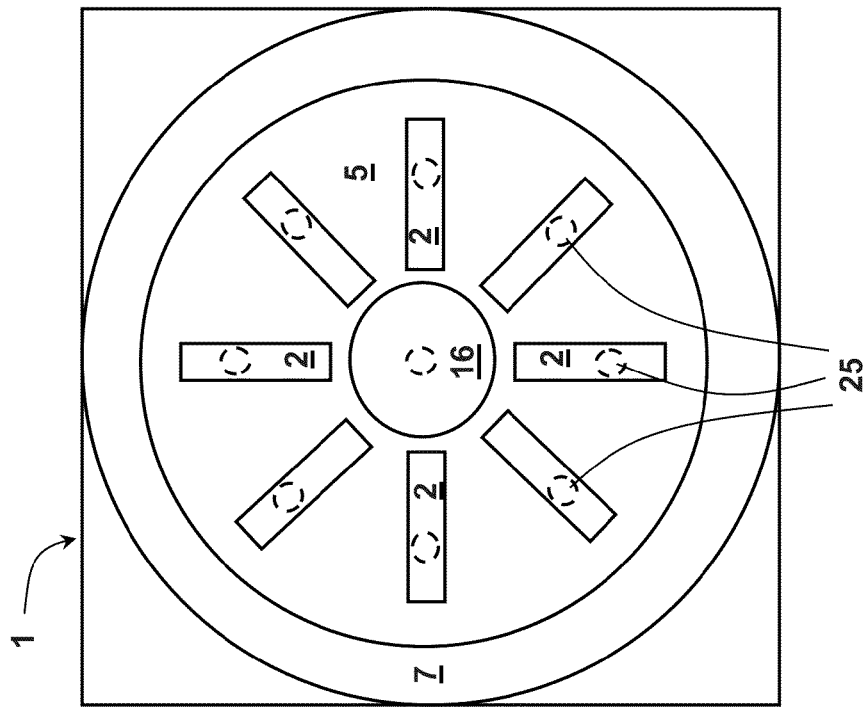
FIG. 3a is a top view of a first embodiment of the laser emitter package of FIG. 2.
Figure 4B:
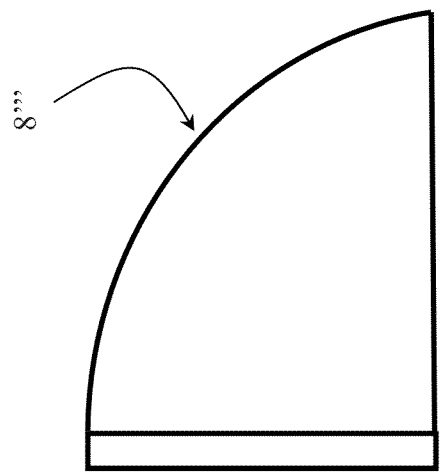
FIGS. 4a and 4b illustrate alternate embodiment of the reflecting ring.
Figure 4A:
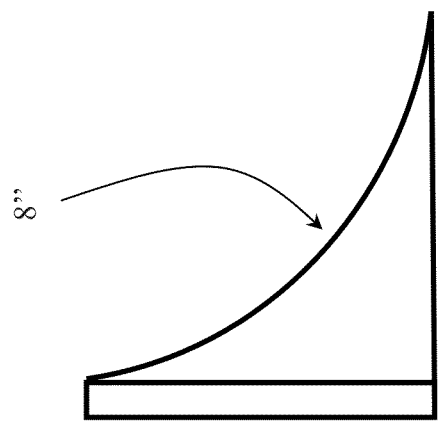

A highly reflective slanted ring 7, e.g. Ag- or Au-plated metal or plastic ring, surrounding the LD's 1 and the raised section of the substrate 3, is used to redirect the laser output beams substantially perpendicularly to the LD's 1 and vertically out of the laser package 1. The ring 7 can be circular or annular, i.e. cylindrical with a substantially triangular cross section, as shown in FIG. 3a. An alternate embodiment of the laser package, generally indicated by 1', is illustrated in FIG. 3b, in which a ring 7' is comprised of multiple sidewalls, such that each LD 2 has its own unique reflector sidewall. In this embodiment, the substrate 3 includes an octagonal raised section 5', or some other multi-sided shape, depending on the number of LD"s 2 in the laser package 1'. The sidewall angle and profile of the ring 7 and 7' can be planar, e.g. at an angle between 30° and 60° (preferably 45°) to the horizontal, or tailored to provide optical power for the specific optical configuration depending on the optics design requirements. For example, with reference to FIGS. 4a and 4b, a concave ring 7'' or a convex ring 7''' having optical power can be provided for collimation, coupling, imaging, etc. Alternatively, the ring 7 can actually be modified into a linear array, where the laser diodes 2, drivers and single mirror are all of nearly the same length.

The height of the raised section 5 of the substrate 3 is raised (i) to allow for the LD's 2 to overhang the edge thereof to prevent solder bridging; and (ii) to prevent obstruction of the laser output beams when they diverge from the front facet of the LD's 2. The reflective ring 7 is mounted on a lower section of the base 4 of substrate 3 surrounding the raised section 5, whereby the light is incident on the reflective ring 7 proximate the middle thereof. Since LD's 2 along a fast and a slow axis with high divergence, the reflective surface(s) 7 will reflect that portion of the light within a desired or predetermined numerical aperture defined by the mirrored surface of the ring 7.

In a preferred embodiment an optical element 8, e.g. lens, lens array for multiple emitters, diffuser, waveplate, etc, is mounted in the opening of the package 1, e.g. on top of the reflective ring 7 in the path of the output light. The optical element 8 can be used to shape the far-field of the output beam.

The package 1 is processed with wafer-scale technology, thereby facilitating high-volume, low-cost packaging. The LD's 2 use similar packaging technology; however, LDs can utilize epoxy for die attach or can be AuSn bonded directly onto the composite substrate 3, since they are CTE matched, which provides ideal thermal conductivity and heat spreading.

Figure 6:
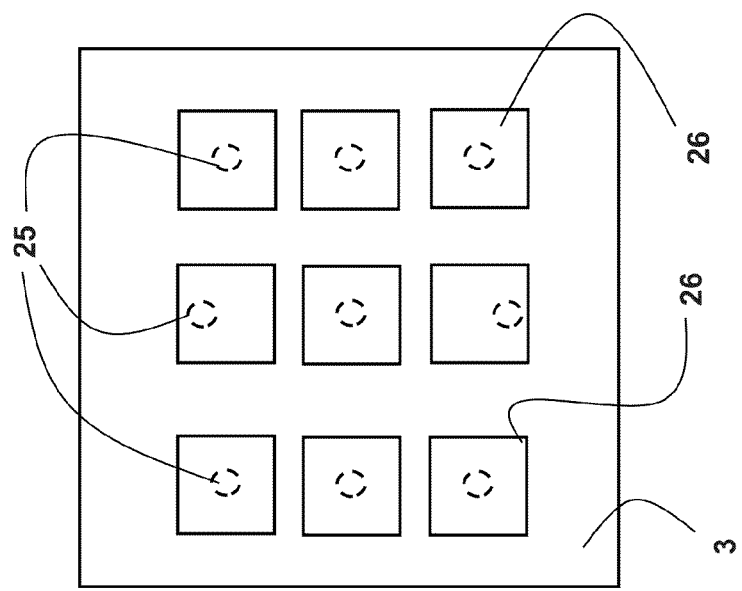
FIG. 6 is a bottom view of the laser emitter package of FIG. 1.
Figure 5:
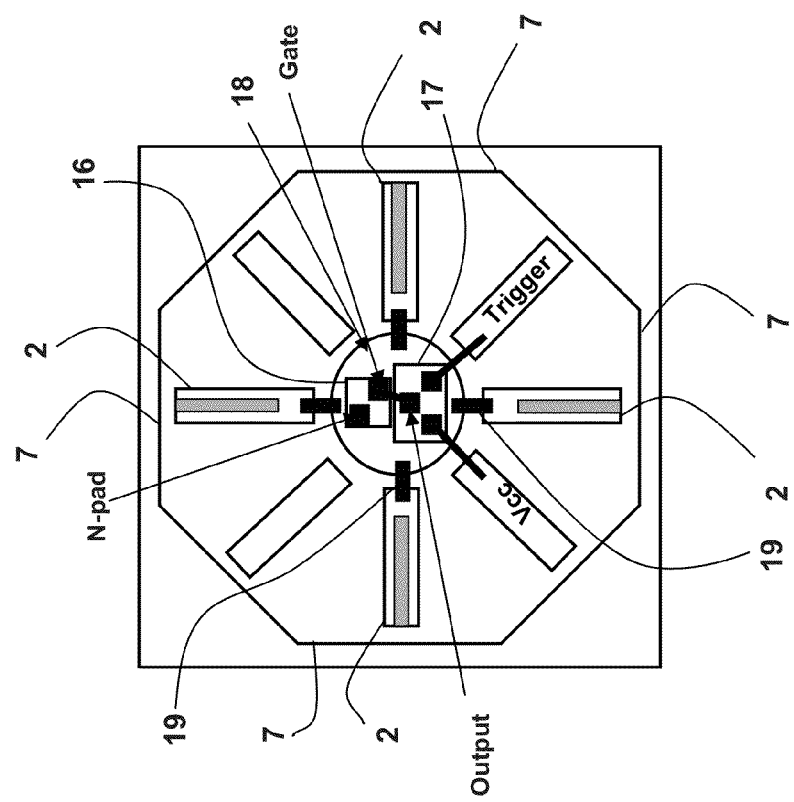
FIG. 5 is a top view of the second embodiment of FIG. 4 including electrical circuitry.

FIGS. 5 and 6 shows the top and bottom view of the proposed package with four LD's 2 electrically-connected in parallel. If metal breaks are fabricated inside the package base and wirebonds are added between the cathode of one LD 2 to the anode diode pad of the adjacent LD 2, then series connection is possible, which may be advantageous for power dissipation/speed.

In general, any number of LD's 2 can be packaged, limited by space considerations. FIG. 5 shows an example of four LD's 2 each with its own reflective sidewall 7. Also shown in FIG. 5 is a metal-oxide-semiconductor field-effect transistor 16 (MOSFET) and a MOSFET driver 17 mounted on a ground pad 18. For high-speed (rise time and fall time shorter than 10 ns) performance, it is advantageous to place the driving electronics 16 and 17 near the LD's 2, e.g. preferably less than 0.5 mm for each current conducting path 19, e.g. wirebond, to minimize inductance from the electrical current path. Low inductance, e.g. less than 5 nH, is required for high speed performance, and typically 1 mm of current conducting path provides 1 nH of inductance desirable for higher frequency operation. The driving electronics 16 and 17 for the LD's 2 can be constructed, but not limited, by MOSFETs and bipolar transistors.

Figure 7:
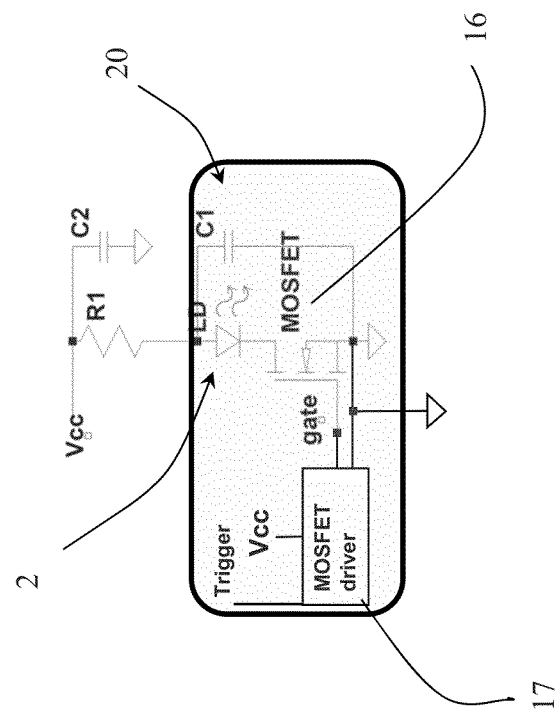
FIG. 7 is a schematic diagram of the electrical circuitry for controlling laser emitters in accordance with the present invention.
Figure 8:
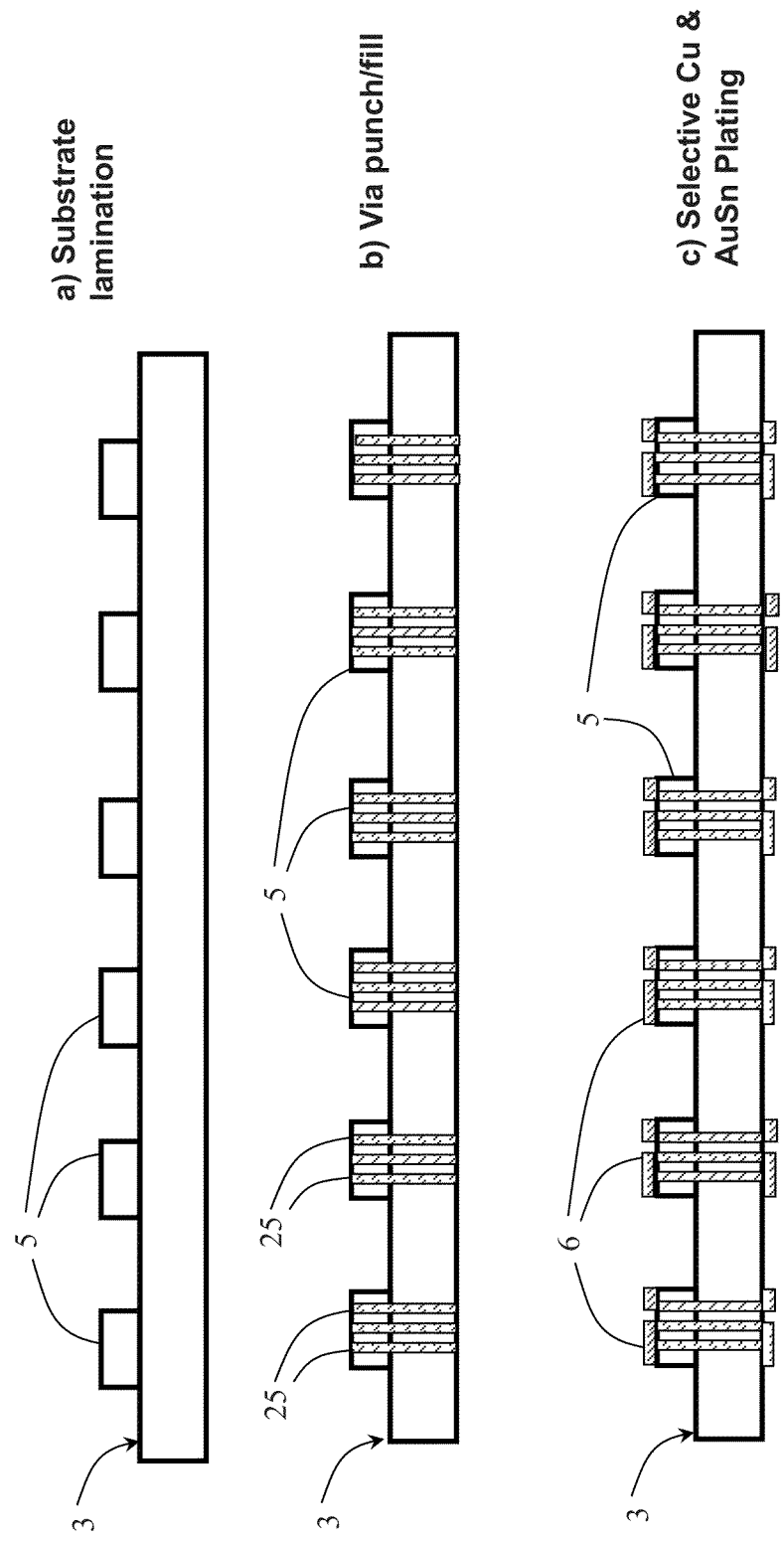
FIGS. 8a to 8i illustrate the manufacturing process of the laser emitter package of the present invention.

With reference to FIG. 7, the encircled components represent illustrative components included in this embodiment, while other components, e.g., resistor and capacitor, will be needed outside of the laser-emitter package 1. In this embodiment, the following components are illustrated: a MOSFET and driver 16, a laser driver 17 and a capacitor 20. The laser driver 17 includes a voltage source connection $V_{CC}$, and trigger, gate and output connections, as is well known.

In the example shown in FIG. 5, one set of laser drivers 17 is shared by four LD's 2. The laser driver 17 is disposed proximate, or in, the center of the raised section 5 of the substrate 3 with the plurality of LD's 2 extending radially outwardly. Preferably, the LD's 2 are equally spaced, i.e. separated by an equal angle, e.g. 90° for four LD's, 120° for three LD's. However, each laser driver design may have different driving capacity, which also depends on the electrical and optical properties of the particular laser diode used in the circuit. One driver 17 may be shared for all laser diodes 2; alternatively, each laser diode 2 may have its own drivers 17. In the latter case, it may be more desirable to modify the design into a linear array, whereby the lasers 2, mirrors 7, drivers 17 all are aligned along a single axis over a similar length.

A highly thermally-conductive material, i.e. >100 W/mK and preferably >=200 W/mK, e.g. copper (400 W/(m.K) @25° C.), SiC (120-200 W/mK), AlN (160 @/mK), CuW (200 W/mK), BeO (250 W/mK), diamond (2000 W/mK), fills the multiple vias 25 that provide interconnect between the electrical and electro-optic elements on the upper surface of the raised section 5 to electrical connection pads 26 on the bottom of the substrate 3. The electrical connection pads 26 are then connected to external power and control sources (not shown).

Packaging and process steps are illustrated in FIGS. 8a to 8i.

Step a): Substrate lamination, the raised sections 5 of the substrates 3 are formed by, e.g. laminating a smaller top layer at a green stage, e.g. before a ceramic co-firing;

Step b): Holes are formed, e.g. punched, through the raised sections 5 of the substrate 3 and filled with the thermally and electrically conductive material to form vias 25, e.g. Copper;

Step c): The upper surface of the raised sections 5 of the substrate 3 are plated with an electrically and thermally conductive material, e.g. copper, forming the plating 6;

Step d): The LD's 2, MOSFET transistors 16 and driver 17 are fixed to the copper plating 6 using a solder, e.g. AuSn, preferably with the emitting facet of the LD's 2 overhanging the edge of the raised section 5;

Step e): The reflector rings 7 are fixed to the lower sections of the substrate 3 around the raised sections 5;

Step f): Wire bonds 19 are used to electrically connect LD's 2, MOSFET transistors 16 and driver 17 according to bond diagram FIG. 7;

Step g): The optical element 8, e.g. lens or diffuser, is mounted in the opening of the package 1 on the upper edge of the reflective ring 7;

Step h): The LD's 2 are tested and burned in.

Step i): The laser packages 1 are separated from each other in a singulation step, e.g. mechanical breaking or a sawing/dicing process.

We claim:

1. A laser emitter package comprising:
    a substrate including a thermally and electrically conductive plating on an upper surface thereof;
    a plurality of laser emitters disposed on the substrate for emitting light parallel to the upper surface of the substrate;

a reflector ring for reflecting the light from the plurality of laser emitters; and a laser driver disposed on the substrate between the plurality of laser emitters for driving the plurality of laser emitters;

wherein the laser emitters extend radially outwardly from around the laser driver.

2. The laser emitter package according to claim 1, wherein the reflector ring includes a reflective surface, which reflects the light from the laser emitters perpendicular to the upper surface of the substrate.

3. The laser emitter package according to claim 1, wherein the reflector ring includes a reflective surface, which is comprised of multiple sidewalls, whereby each laser emitter has a unique reflector sidewall.

4. The laser emitter package according to claim 1, wherein the reflector ring is comprised of an annular ring surrounding the plurality of laser emitters, and a reflective surface tilted at an angle to the upper surface of the substrate.

5. The laser emitter package according to claim 1, wherein the reflector ring includes a reflective surface with optical power disposed at an angle to the laser emitters for focusing or collimating the light.

6. The laser emitter package according to claim 1, wherein the substrate includes a raised section for supporting the laser emitters proximate to a middle of the reflector ring to prevent obstruction of the light by the substrate as the light diverges from a front facet of the laser emitters.

7. The laser emitter package according to claim 6, wherein ends of the laser emitters overhang an edge of the raised section.

8. The laser emitter package according to claim 1, further comprising an optical element disposed in the path of the light to shape the far-field of the output beam.

9. The laser emitter package according to claim 1, further comprising electrically and thermally conductive vias extending between the plating on the upper surface of the substrate and pads on a lower surface of the substrate.

10. The laser emitter package according to claim 1, wherein the substrate is comprised of a plurality of materials, which has a composite coefficient of thermal expansion substantially the same as the laser emitter material.

11. The laser emitter package according to claim 1, wherein the laser emitters are electrically connected to the laser driver via conducting paths less than 0.5 mm long.

* * * * *